United States Patent
Kimura (10) Patent No.: US 10,242,716 B2
(45) Date of Patent: Mar. 26, 2019

(54) SEMICONDUCTOR DEVICE HAVING A SLIT FOR ALIGNING A CONNECTOR AND A HOLE FOR DETERMINING POSITIONAL ACCURACY OF THE SLIT

(71) Applicant: Toshiba Memory Corporation, Tokyo (JP)

(72) Inventor: Naoki Kimura, Ebina Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/448,520

(22) Filed: Mar. 2, 2017

(65) Prior Publication Data

US 2018/0090182 A1 Mar. 29, 2018

(30) Foreign Application Priority Data

Sep. 29, 2016 (JP) .................. 2016-191394

(51) Int. Cl.
| | | |
|---|---|---|
| *G11C 5/06* | (2006.01) | |
| *H01L 25/00* | (2006.01) | |
| *H03F 3/45* | (2006.01) | |
| *G11C 5/04* | (2006.01) | |
| *H01L 21/768* | (2006.01) | |
| *H01L 21/66* | (2006.01) | |
| *H01L 23/538* | (2006.01) | |
| *H01L 25/065* | (2006.01) | |

(52) U.S. Cl.
CPC .............. *G11C 5/06* (2013.01); *G11C 5/04* (2013.01); *H01L 21/76895* (2013.01); *H01L 22/14* (2013.01); *H01L 23/5386* (2013.01); *H01L 25/0655* (2013.01); *H01L 25/50* (2013.01)

(58) Field of Classification Search
CPC ....... G11C 5/06; G11C 5/04; H01L 21/76895; H01L 22/14; H01L 25/50; H01L 25/0655; H01L 23/5386
See application file for complete search history.

(56) References Cited

U.S. PATENT DOCUMENTS

| | | | |
|---|---|---|---|
| 2008/0217052 A1 | 9/2008 | Matsui | |
| 2011/0156225 A1* | 6/2011 | Hozoji | .................. H01L 21/561 257/659 |
| 2016/0351232 A1* | 12/2016 | Sugita | ............... G06F 17/30867 |

FOREIGN PATENT DOCUMENTS

| | | |
|---|---|---|
| JP | S61-123564 U | 8/1986 |
| JP | H6-7267 U | 1/1994 |
| JP | 2011-108988 | 6/2011 |
| JP | 2015-130444 | 7/2015 |

* cited by examiner

*Primary Examiner* — Jerome Leboeuf
(74) *Attorney, Agent, or Firm* — Kim & Stewart LLP (57) ABSTRACT

A semiconductor device includes a substrate, a nonvolatile semiconductor memory disposed on a surface of the substrate, and a controller disposed on a surface of the controller. The substrate has a slit on an edge on which interface connection terminals are formed, a ground pattern, first and second wiring patterns that are electrically connected to the ground pattern and extend in a direction in which the slit extends, and a through hole that is formed between the first and second wiring patterns and is large enough along a dimension between the first and second wiring patterns to span substantially all of the spacing between the first and second wiring patterns.

12 Claims, 6 Drawing Sheets

SEMICONDUCTOR DEVICE HAVING A SLIT FOR ALIGNING A CONNECTOR AND A HOLE FOR DETERMINING POSITIONAL ACCURACY OF THE SLIT

CROSS-REFERENCE TO RELATED APPLICATION

This application is based upon and claims the benefit of priority from Japanese Patent Application No. 2016-191394, filed Sep. 29, 2016, the entire contents of which are incorporated herein by reference.

FIELD

Embodiments of the present disclosure relate to a semiconductor device.

BACKGROUND

A semiconductor device of one type has a nonvolatile memory and a controller that are mounted on a substrate, and a slit is formed in a connector of the semiconductor device, which is connected to a host.

DETAILED DESCRIPTION

An embodiment is directed to improving reliability of a semiconductor device.

In general, according to an embodiment, a semiconductor device includes a substrate, a nonvolatile semiconductor memory disposed on a surface of the substrate, and a controller disposed on a surface of the controller. The substrate has a slit on an edge on which interface connection terminals are formed, a ground pattern, first and second wiring patterns that are electrically connected to the ground pattern and extend in a direction in which the slit extends, and a through hole that is formed between the first and second wiring patterns and is large enough along a dimension between the first and second wiring patterns to span substantially all of the spacing between the first and second wiring patterns.

Embodiments will now be described with reference to the accompanying drawings.

In the present disclosure, multiple expressions are used for several elements. Such expressions are merely examples, and the elements may be expressed using another expression. Further, an element for which several expressions are not used may be expressed by another expression.

In addition, drawings are schematic, and the relationship between the thickness and the planer dimension and the ratio of the thickness of respective layers may differ from the actual one. Moreover, the dimensional relationship and the ratio of a portion may be different among drawings.

First Embodiment

Figure 1A:
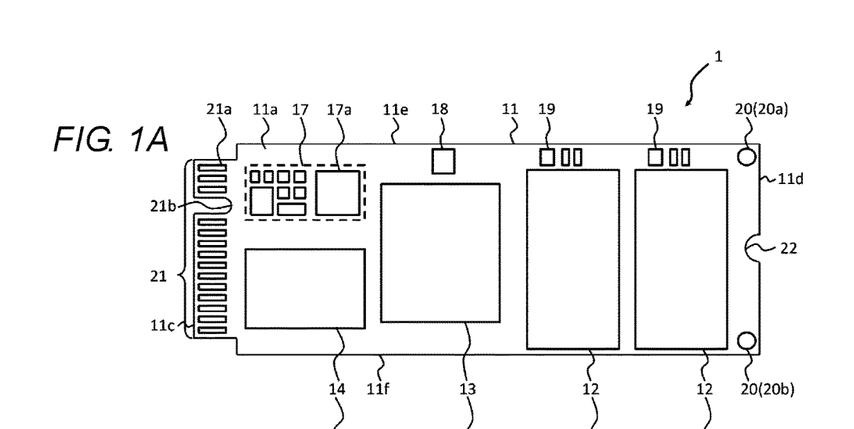
FIG. 1A is a plan view of a semiconductor device according to a first embodiment.
Figure 1B:
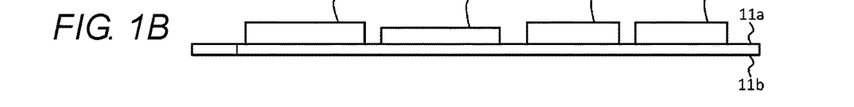
FIG. 1B is a side view of the semiconductor device.
Figure 2:
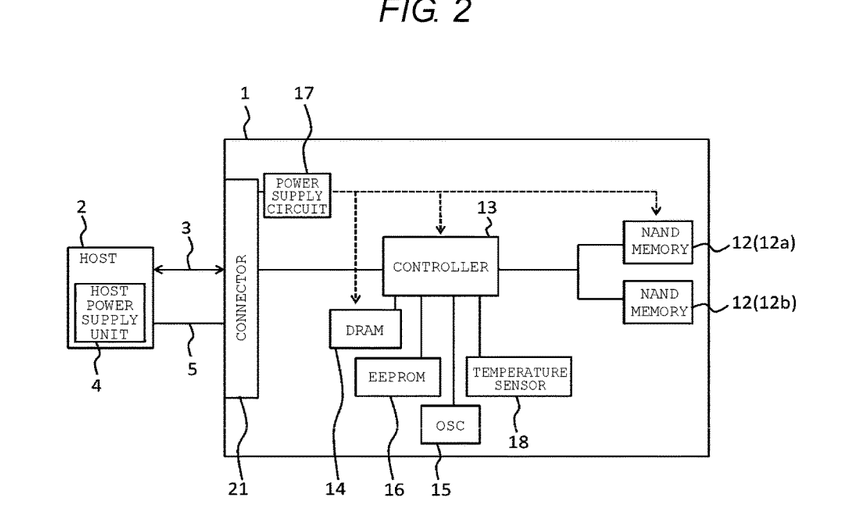
FIG. 2 shows a system configuration of the semiconductor device according to the first embodiment.

FIGS. 1A and 1B show a semiconductor device 1 according to a first embodiment. Specifically, FIG. 1A is a top view, and FIG. 1B is a side view. Further, FIG. 2 shows a system configuration of the semiconductor device 1 according to the first embodiment. The semiconductor device 1 according to the present embodiment is a memory system, such as an SSD (Solid State Drive), but not limited thereto.

As shown in FIG. 2, the semiconductor device 1 is connected to a host 2. The host 2 in the present embodiment may be a variety of electronic devices, including a notebook portable computer, a tablet-type device, a detachable notebook PC and a mobile phone. The host 2 may also be a server device used in a data center or the like. The semiconductor device 1 may be used as an external memory of the host 2, for example.

As shown in FIGS. 1A, 1B, and 2, the semiconductor device 1 includes a substrate 11, a nonvolatile memory 12, a controller 13, a volatile memory 14 operable at higher speed than the nonvolatile memory 12, an oscillator (OSC) 15, an EEPROM (Electrically Erasable and Programmable ROM) 16, a power supply circuit 17, a temperature sensor 18, and other electronic components 19 such as a resistor and a capacitor. For convenience of explanation, the oscillator 15 and the EEPROM 16 are omitted in FIGS. 1A and 1B.

For example, the nonvolatile memory 12 is an NAND flash memory. Hereinafter, the nonvolatile memory 12 is referred to as an "NAND memory 12." However, the nonvolatile memory 12 may be another nonvolatile memory, for example, an MRAM (Magnetoresistive Random Access Memory).

Further, the volatile memory 14 is, for example, a DRAM (Dynamic Random Access Memory). The volatile memory 14 is referred to as a "DRAM memory 14" in the following description. However, without being limited thereto, the volatile memory 14 may be another volatile memory.

The NAND memory 12 and the controller 13 in the present embodiment are implemented as a semiconductor package that is an electronic component. For example, in a semiconductor package of the NAND memory 12, a plurality of semiconductor chips (memory chips) are stacked and sealed in one package.

The substrate 11 is, for example, a substantially rectangular circuit board made of a material such as a glass epoxy resin, and defines the outer dimension of the semiconductor device 1. In the present embodiment, the substrate 11 is a multilayer substrate formed of a plurality of layers, for example, eight layers, but without being limited thereto, the number of layers of the substrate 11 may be, for example, four or two.

The substrate 11 has a first surface 11a, and a second surface 11b opposite to the first surface 11a. It is noted that the first surface 11a and the second surface 11b may also be referred to as a main surface, for example. Further, in the present disclosure, a surface other than the first surface 11a and second surface 11b among the surfaces of the substrate 11 is defined as a "side surface". In the semiconductor device 1, the first surface 11a is a component-mounting surface on which the NAND memory 12, the controller 13, the DRAM 14, the oscillator 15, the EEPROM 16, the power supply circuit 17, the temperature sensor 18, and the other electronic components 19 such as a resistor and a capacitor are mounted.

Further, the second surface 11b is anon-mounting surface on which no component, such as the NAND memory 12, is mounted. Since no component is mounted on the second surface 11b, the semiconductor device 1 can be made thinner, leading to space saving, and hence, achieving the miniaturization and thinning of the host 2 on which the semiconductor device 1 is mounted.

However, in the semiconductor device 1, a component, such as the NAND memory 12, may also be mounted on the second surface 11b. Further, the second surface 11b may have another function, for example, a pad for testing for performance check of a product.

As shown in FIG. 1, the substrate 11 has a first edge 11c, and a second edge 11d opposite to the first edge 11c. The substrate 11 also has a third edge 11e and a fourth edge 11f, both of which are located between the first edge 11c and the second edge 11d. The first edge 11c has a connector 21 (interface portion, substrate interface portion, terminal portion, connecting portion). In the present embodiment, the connector 21 is, for example, an LIF (Low Insertion Force) connector.

In addition, through-holes 20 (opening, hole, through-hole, fixing portion) penetrating the first surface 11a and the second surface 11b are provided on the side of the second edge 11d of the substrate 11. In other words, the through-holes 20 are located between the second edge 11d of the substrate 11 and the NAND memory 12. For convenience of explanation, in the present embodiment, among the through-holes 20, the through-hole 20 located on the side of the third edge 11e is referred to as a through-hole 20a, and the through-hole 20 located on the side of the fourth edge 11e is referred to as a through-hole 20b. In the following description, "through-holes 20" refer to both of the through-hole 20a and the through-hole 20b.

The connector 21 includes a plurality of connection terminals 21a (interface connection terminals, metal terminals, patterns, pads). The connector 21 is electrically connected to the host 2, and exchanges a signal (control signal and data signal) with the host 2. In addition, the connector 21 also functions as a power supply input unit that supplies power supplied from the host 2 to the power supply circuit 17.

The first edge 11c is a shorter side of the substrate 11 in the present embodiment. That is, the connector 21 is provided along the first edge 11c of the substrate 11 in the present embodiment. Further, a slit 21b (depressed portion) is formed in the connector 21 at a position offset from the center position of the first edge 11c of the substrate 11 so as to be coupled with a not-shown projection (key, protrusion) provided on the host 2. This may prevent the semiconductor device 1 from being mounted inside-out.

The semiconductor device 1 is electrically connected to the host 2 through the interface 3. The host 2 executes data access control with respect to the semiconductor device 1. For example, when the host 2 sends a write request, a read request, and an erase request to the semiconductor device 1, the writing, reading, and erasing of data are performed on the semiconductor device 1.

The interface 3 according to the present embodiment is, for example, the PCIe (Peripheral Component Interconnect Express). That is, a high-speed signal conforming to the PCIe standard (high-speed differential signal) flows between the connector 21 and the host 2.

Alternatively, another standard such as SAS (Serial Attached SCSI), SATA (Serial Advanced Technology Attachment), NVMe (Non Volatile Memory Express) or USB (Universal Serial Bus) may be used for the interface 3.

The power supply circuit 17 is electrically connected to a host power supply unit 4 via the connector 21 and a power supply line 5. By the power supply circuit 17, the required power is supplied from the host power unit 5 to the semiconductor device 1. The power supply circuit 17 supplies power to the NAND memory 12, the controller 13, and the DRAM 14. The power supply circuit 17 is preferably disposed in the vicinity of the connector 21 in order to suppress loss of power supplied from the host 2.

The power supply circuit 17 includes a power supply IC 17a to which electronic components such as a resistor, a capacitor, an inductor, and the like are connected. The power supply IC 17a may be referred to as a power supply unit, a power supply chip, or a combined power supply control IC, and the power supply IC 17a is, for example, a PMIC (Power Management Integrated Circuit), but not limited thereto.

The controller 13 controls operation of the NAND memory 12. That is, the controller 13 controls the writing, reading, and erasing of data with respect to the NAND memory 12. Further, the controller 13 controls operation, such as data management, that is internally carried out by the semiconductor device 1 on its own, including a garbage collection process and a wear leveling process in the NAND memory 12.

The garbage collection process is a process of moving data other than unnecessary (invalid) data to another physical block, and invalidating data in the source physical block in order to reuse the source physical block. In other words, in this process, valid data in the source physical block are written (copied) to the other physical block, and all data in the source physical block are invalidated or erased.

The wear leveling process is a process of executing control such that the number of times of rewriting becomes even among blocks. For example, data in a block at which the number of times of rewriting is high are moved to another block at which the number of times of rewriting is low. In addition, data that are frequently rewritten may be moved to a block at which the number of times of rewriting is low, and data that are less frequently rewritten, such as an OS file in a computer, may be moved to a block at which the number of times of rewriting is high in order to level the number of times of rewriting among the blocks. Specific processing of the wear leveling process is not limited thereto.

The DRAM 14 is an example of a volatile memory as described above, and used for data cache and storage of management information to manage the NAND memory 12. The oscillator 15 supplies an operation signal of a predetermined frequency to the controller 13. The EEPROM 16 stores a control program and the like as fixed information.

The temperature sensor 18 monitors the temperature of the controller 13, for example. The temperature sensor 18 is mounted in the vicinity of the controller 13 on the substrate 11, for example, but the position of the temperature sensor 18 is not limited thereto. Further, the temperature sensor 18 does not need to be provided on the substrate 11, and may be provided as a function of the controller 13.

When all components mounted on the substrate 11 are mounted only on the first surface 11a as described above, the second surface 11b is a non-component mounting surface on which no component is mounted. This allows the semiconductor device 1 to be thin, and hence, allows the host 2 on which the semiconductor device 1 is mounted to be miniaturized and thin, as compared with a case in which substrate-mounted components project from the surface on both surfaces of the substrate 11.

Figure 3:
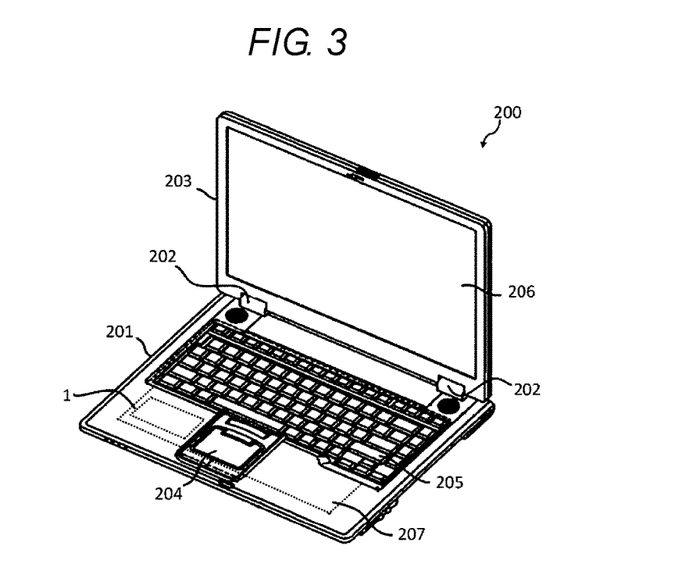
FIG. 3 illustrates a notebook portable computer including the semiconductor device according to the first embodiment.

As described above, the semiconductor device 1 according to the present embodiment is connected to the host 2 such as a notebook portable computer, a tablet-type device, and a detachable notebook PC. FIG. 3 illustrates a semiconductor device 1 used for a notebook portable computer 200.

As shown in FIG. 3, a display device 203 is rotatably provided on an input device 201 of the notebook portable computer 200 using a hinge mechanism 202. Operation units such as a touch pad 204 and a keyboard 205 are provided on the input device 201. A display mechanism, not shown, such as an LCD (Liquid Crystal Display) may be provided on the display device 203.

Further, a motherboard 207 that has a control circuit for controlling the operation unit such as the touch pad 204 and the keyboard 205 and a display device 206 thereon is provided on the display device 203. A connector (not shown) is provided on a printed circuit board 207, and the semiconductor device 1 is implemented through the connector. The motherboard 207 and the semiconductor device 1 are provided inside the display device 203, which are shown by broken lines in FIG. 3. Further, a fixing hole (semicircle) 22 (not shown) provided in the substrate 11 of the semiconductor device 1 may be used to screw and fix the semiconductor device 1 and the motherboard 207.

The motherboard 207 and the semiconductor device 1 may be provided on the side of the display device 203, and the hinge mechanism 202 may be used to connect the input device 201 and the display device 203 such that the devices may be separable from one another. In this case, when a touch panel that recognizes handwriting inputs is provided on the display device 203, the display device 203 can be used as a tablet-type device.

Figure 4:
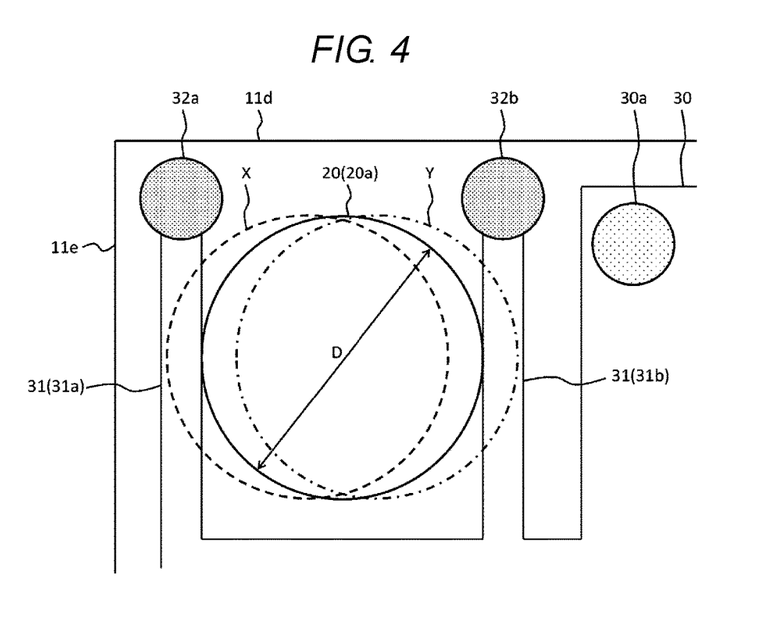
FIG. 4 shows an enlarged view of vicinity of a through-hole formed in the semiconductor device according to the first embodiment.

FIG. 4 shows an enlarged view of the vicinity of the through-hole 20 (20a) according to the present embodiment. In the present embodiment, the substrate 11 has a ground pattern 30. The ground pattern 30 is formed of a conductive material such as copper foil or the like. A ground terminal 30a that is electrically connected to the ground pattern 30 is provided on the substrate 11.

Further, test patterns 31 electrically connected to the ground pattern 30 and extending substantially in parallel with the third edge 11e are provided in the vicinity of the through-hole 20a. In the present embodiment, for convenience of explanation, among the test patterns 31, the test pattern 31 provided between the through-hole 20a and the third edge 11e is especially referred to as a test pattern 31a, and the test pattern 31 opposite to the test pattern 31a with respect to the through-hole 20a is especially referred to as a test pattern 31b. In addition, in the following description, "test patterns 31" refer to both of the test pattern 31a and the test pattern 31b. A distance between the test pattern 31a and the test pattern 31b is formed to be substantially equal to a diameter of the through-hole 20a. In the present embodiment, without being limited thereto, for example, Dp=1.8 [mm] where Dp represents a normal diameter of the through-hole 20. As used herein, a normal diameter Dp is a designed value of the diameter determined, and it is not necessarily the same as an actual diameter D.

Further, a test terminal 32a connected to the test pattern 31a, and a test terminal 32b connected to the test pattern 31b are provided on the substrate 11. The test patterns 31a and 31b may be integrally formed of the same material as that of the ground pattern 30, or may be formed of a different material from that of the ground pattern 30. In addition, in the following description, "test terminals 32" refer to both of the test terminal 32a and the test terminal 32b.

Figure 5:
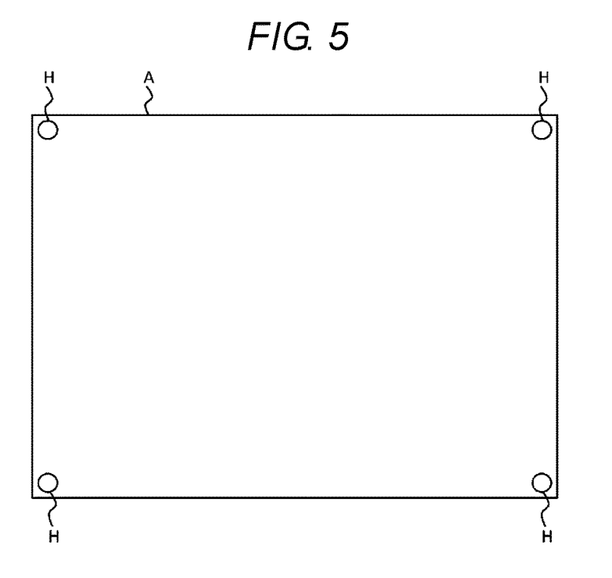
FIGS. 5-8 illustrate a method of manufacturing a substrate of the semiconductor device according to the first embodiment.

Next, a manufacturing method of the substrate 11 used in the semiconductor device 1 will be described with reference to FIGS. 5 to 8. First, as shown in FIG. 5, a through-hole for connecting a hole H for fixing and a plurality of layers are formed by NC (Numerical Control) drilling in each of four corners of a multi-layered substrate A. Each layer of the substrate A is bonded by, for example, prepreg, and pressed and heated for curing thereafter.

Figure 6:
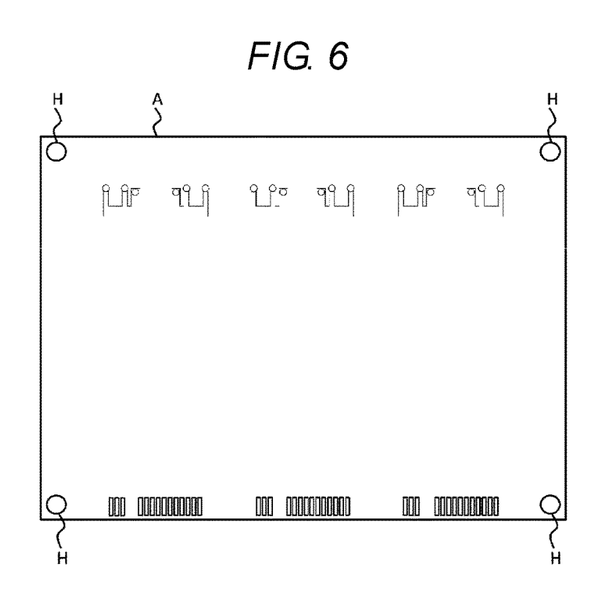

As shown in FIG. 6, the connection terminal 21a that is used in the connector 21 is formed on the substrate A cured as described above. In addition, the machining of the ground pattern 30 (not shown) and the ground terminal 30a (not shown), the machining of the solder resist onto the surface layer, the machining of a pad (not shown) for mounting the NAND memory 12, the controller 13 or the like onto the substrate 11 or the like are also performed in this step. In addition, the test patterns 31 and the test pads 32, described above, are also machined. It is assumed that, for example, three substrates 11 are manufactured from the substrate A. For convenience of explanation, a portion of the configuration is omitted in FIG. 6.

Figure 7:
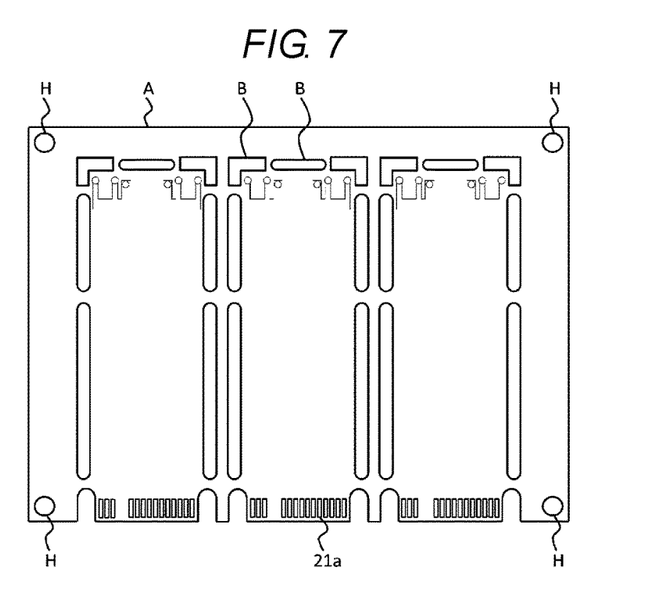

Then, the substrate A is fixed to a router using the hole H, and a machining slit B is machined in the substrate A, as shown in FIG. 7. The machining slit B may simply be referred to as a slit B.

Figure 8:
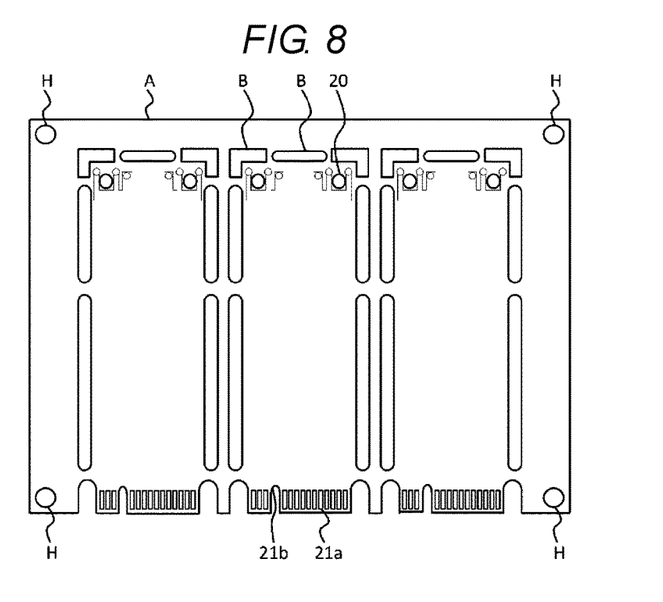

Thereafter, as shown in FIG. 8, with the substrate A being fixed to the router using the hole H, the through-hole 20 is formed in the substrate 11 and the slit 21b is formed in the first edge 11c. Finally, the NAND memory 12, the controller and the like are mounted, the remaining portion (perforation) after the machining of the slit B is cut after reflow soldering, and three substrates 11 are manufactured.

In the present embodiment, the test pattern 31 is machined earlier than the through-hole 20 (20a). Therefore, when the substrate A is fixed at a position offset from a normal fixed position, the through-hole 20a is also formed at a position offset from a normal position. Thus, when the through-hole 20a is machined, at least a portion of the test pattern 31 is cut away.

On the other hand, as described above, the through-hole 20a and the slit 21b are machined in the same step. Therefore, when the through-hole 20a is formed (machined) at a position offset from the normal position, the slit 21b is also formed (machined) at a position offset from the normal position.

As described above, the slit 21b is coupled with a projection formed on the connector of the host 2. Therefore, when the slit 21b is machined at a position offset from the normal position with respect to the connection terminal 21a of the connector 21, the connection between the connector formed on the host 2 and the connector 21 of the semiconductor device 1 may not be properly made. Therefore, it is not desirable that each of the slit 21b and the through-hole 20a is machined at a position offset from the normal position.

Considering this issue, in the present embodiment, the test pattern 31 is formed on the substrate 11 around the position in which the through-hole 20a is formed, as shown in FIG. 4. Therefore, when the through-hole 20a is machined at a position offset from the normal position, at least a portion of the test pattern 31 is cut away.

On the other hand, the test terminal 32 is electrically connected to the ground terminal 30a via the test pattern 31 and the ground pattern 30. Therefore, since it is possible to determine whether or not the test pattern 31 is cut away by measuring impedance between the test terminal 32 and the ground terminal 30a, it is possible to determine whether or not the through-hole 20a is machined at a position offset from the normal position.

Figure 9:
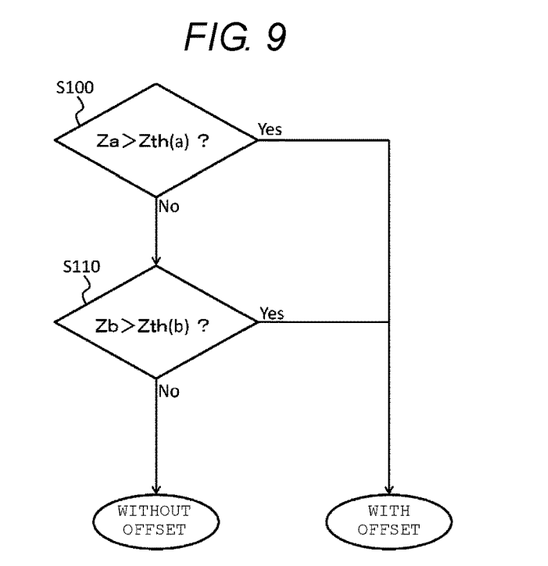
FIG. 9 is a flow chart illustrating an example of a procedure of detecting offset of a machining position of the through-hole carried out in the first embodiment.

FIG. 9 shows a flow chart illustrating an example of a procedure for detecting the offset of the machining position of the through-hole 20a in the present embodiment. The procedure for detecting the offset will be described with reference to FIG. 9.

First, it is determined whether or not an impedance Za between the test terminal 32a and the ground terminal 30a is greater than a predetermined threshold value Zth (a) (S100). When Za>Zth (a) (S100: Yes), at least a portion of the test pattern 31a will be cut away during the machining of the through-hole 20a. Therefore, it can be determined that the through-hole 20a is machined at a position offset from the normal position.

In this case, it can be determined that the through-hole 20a and the slit 21b are machined at a position offset toward the third edge 11e of the substrate 11 with respect to the normal position. FIG. 4 shows, by the broken line (X), an example of a machining position of the through-hole 20a when S100 is Yes. On the other hand, when Za Zth (a) (S100: No), the process proceeds to S110.

Next, it is determined whether or not impedance Zb between the test terminal 32b and the ground terminal 30a is greater than a predetermined threshold value Zth (b) (S110). When Zb>Zth (b) (S110: Yes), at least a portion of the test pattern 31b is cut away during the machining of the through-hole 20a. Therefore, it can be determined that the through-hole 20a is machined at a position offset from the normal position.

In this case, it can be determined that, in addition to the through-hole 20a, the slit 21b that is machined in the same step as the through-hole 20a is machined at a position offset toward the fourth edge 11f of the substrate 11 with respect to the normal position. FIG. 4 shows, by the chained line (Y), an example of a machining position of the through-hole 20a when S110 is Yes. On the other hand, when Zb≤Zth (b) (S110: No), it can be determined that the offset of the machining position does not occur in machining the through-hole 20a.

Zth (a) and Zth (b) may be arbitrarily set, and Zth (a)=Zth (b) may also be used. For example, the impedance between the test terminals 32 (32a and 32b) and the ground terminal 30a when the through-hole 20a is machined at the normal position (i.e., when the test pattern 31 is not cut away) is measured in advance, and Zth (a) and Zth (b) may be set to the measured value.

In machining the through-hole 20a, the dimensional tolerance α may be considered. That is, the distance between the test pattern 31a and the test pattern 31b may be greater than the normal diameter Dp of the through-hole 20a by the dimensional tolerance α. In the present embodiment, for example, α=0.1 [mm], where α represents the dimensional tolerance, but is not limited thereto. When the dimensional tolerance α=0.1, the diameter D of the machined actual through-hole 20 satisfies Dp−α≤D Dp+α. When it is applied to the example of each dimension described above, for example, the diameter D of the through-hole 20 is 1.7≤D≤1.9.

For example, it is assumed that d=0.1 [mm], where d represents the width of the test pattern 31 (the length of the shorter side of the substrate 11, the length of the aligning direction with the through-hole 20), and D=1.9 [mm] because of the influence of the dimensional tolerance α in machining the through-hole 20, where D represents the actual diameter, even though the position of the actually machined through-hole 20 is not offset from the normal position, at least a portion of the test patterns 31a and 31b is cut away, and therefore, the impedance is changed.

Figure 10:
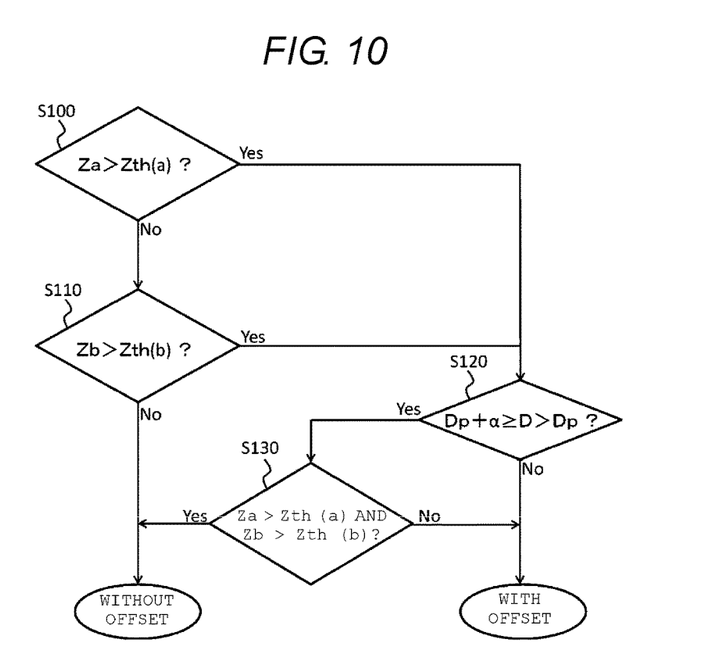
FIG. 10 is a flow chart illustrating another example of the procedure of detecting the offset.

FIG. 10 shows a flow chart illustrating another example of detecting the deviation of the machining position of the through-hole 20a in the present embodiment.

First, similarly to the description of FIG. 9, the impedance between the test terminal 32 and the ground terminal 30a, and the predetermined threshold value Zth are compared in S100 and S110. When Za>Zth (a) (S100: Yes), or Zb>Zth (b) (S110: Yes), the process proceeds to S120.

Here, it is assumed that there is a dimensional tolerance α in machining the through-hole 20a as described above, the diameter of the normal through-hole 20a is Dp, and the diameter D of the through-hole 20a satisfies Dp−α≤D≤Dp+α.

When Za>Zth (a) (S100: Yes), or Zb>Zth (b) (S110: Yes), the diameter D of the machined through-hole 20a is measured, and it is determined that whether Dp+α≥D>Dp is satisfied (S120). That is, it is determined whether or not the diameter D of the machined through-hole 20a is larger than an appropriate diameter Dp.

When Dp+α≥D>Dp is not satisfied (S120: No), the diameter D of the through-hole 20a is machined so as to be smaller than the appropriate diameter Dp, and at least a portion of the test pattern 31 is cut away. Accordingly, the through-hole 20a is considered to be machined with the position offset from the normal position.

On the other hand, When Dp+α≥D>Dp is satisfied (S120: Yes), the diameter D of the through-hole 20a is machined to be larger than the appropriate diameter Dp. In this case, it is determined whether or not Za>Zth (a) and Zb>Zth (b) are satisfied (S130).

When Za>Zth (a) and Zb>Zth (b) (S130: Yes), the cutting-away of the test pattern 31 is considered to be caused by the dimensional tolerance of the through-hole 20a, the position of the through-hole 20a is determined as not being offset from the normal position, and the slit 21b is considered to be machined at the normal position. That is, since both of the test patterns 31a and 31b are cut away, the diameter D of the machined through-hole 20a is machined to be larger than the appropriate diameter Dp.

On the other hand, when Za>Zth (a) and Zb>Zth (b) are not satisfied (S130: No), that is, when only one of the test patterns 31 (31a or 31b) is cut away, cutting-away of the test pattern 31 is considered to be not caused by the dimensional tolerance of the through-hole 20a, and the position of the through-hole 20a is determined to be offset from the normal position.

As described above, on the semiconductor device 1 according to the present embodiment, the test pattern 31 is formed on the substrate 11 around the position in which the through-hole 20a is formed. For that reason, when the through-hole 20a is machined at a position offset from the normal position, at least a portion of the test pattern 31 is cut away. Accordingly, whether or not the test pattern 31 is cut away can be determined by measuring the impedance between the test terminal 32 and the ground terminal 30a. Also, based on the result of the determination, whether or not the through-hole 20a is machined at a position offset from the normal position can be determined. This means that the deviation of the position of the slit 21b in the connector 21 can be easily detected, which may contribute to improve reliability of the connection between the semiconductor device 1 and the host 2.

The procedure described in FIGS. 9 and 10 of the present embodiment is only an example. For example, in S130 of FIG. 10, even when Za>Zth (a) and Zb>Zth (S130: Yes), it may be determined whether or not the position where the through-hole 20a is machined is offset, depending on the cut depth (length, area) of each test pattern 31. These conditions may be appropriately changed and selected depending on the diameter D of the through-hole 20a, the magnitude of the dimensional tolerance α, the width of the test pattern 31 (the length of the minor axis direction of the substrate 11), the allowable range of the deviation of the position of the slit 21b and the like.

Second Embodiment

Figure 11:
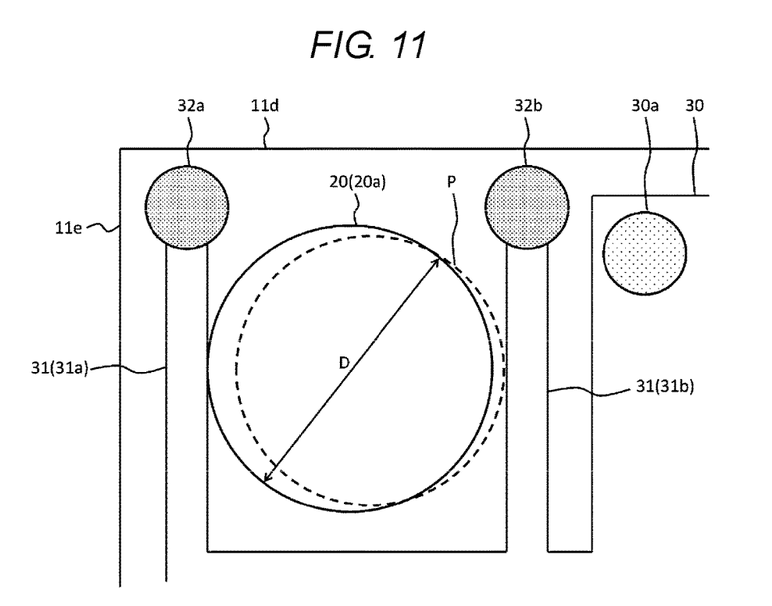
FIG. 11 shows an enlarged view of vicinity of a through-hole formed in a semiconductor device according to a second embodiment.
Figure 12:
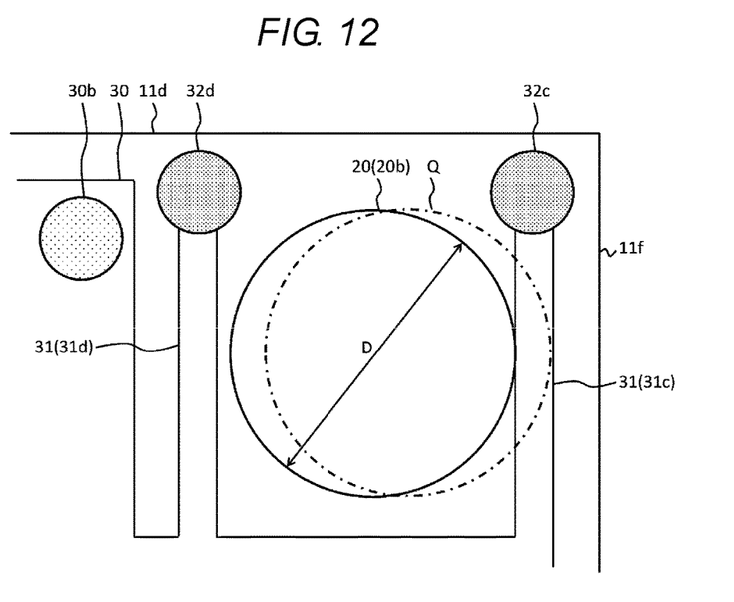
FIG. 12 shows an enlarged view of vicinity of another through-hole formed in a semiconductor device according to the second embodiment.

Next, a second embodiment will be described. FIG. 11 shows an enlarged view of the vicinity of the through-hole 20 (20a) according to the second embodiment. Further, FIG. 12 shows an enlarged view of the vicinity of the through-hole 20 (20b) according to the second embodiment. In the following description, the same numbers are used for the same components as those in the first embodiment, and detailed description thereof will be omitted. Moreover, the appearance and configuration of the semiconductor device 1 in the present embodiment is the same as those in FIGS. 1 and 2.

In the present embodiment, a ground terminal 30b that is electrically connected to the ground pattern 30 is formed on the substrate 11. Further, test patterns 31 electrically connected to the ground pattern 30, and extending substantially in parallel with the fourth edge 11f are formed in the vicinity of the through-hole 20b.

In the present embodiment, for convenience of explanation, among the test patterns 31, the test pattern 31 formed between the through-hole 20b and the fourth edge 11f is especially referred to as a test pattern 31c, and the test pattern 31 opposite to the test pattern 31c with respect to the through-hole 20b is especially referred to as a test pattern 31d. In addition, in the following description, "test patterns 31" refer to the test patterns 31a, 31b, 31c and 31d.

Further, a test terminal 32c connected to the test pattern 31c, and a test terminal 32d connected to the test pattern 31d are formed on the substrate 11. The test patterns 31c and 31d may be integrally formed of the same material as that of the ground pattern 30, or may be formed of a different material from that of the ground pattern 30. In addition, in the following description, "test terminals 32" refer to the test terminals 32a, 32b, 32c and 32d.

Further, in the present embodiment, the ground terminal 30b is not necessarily provided, that is, the ground terminal 30b may be omitted when the ground terminal 30a is electrically connected to the test terminals 32c and 32d.

In the present embodiment, the test patterns 31b and 31d are spaced by a predetermined distance in the extending direction of the first edge 11c (the minor axis direction of the substrate 11, the short side of the substrate 11), and aligned with the through-holes 20 (20a and 20b), respectively. At this time, a predetermined distance is, for example, 0.05 [mm], but not limited thereto.

In the second embodiment, unlike the first embodiment, the test patterns 31c and 31d and the test terminals 32c and 32d are formed not only on the periphery of the through-hole 20a, but also on the periphery of the through-hole 20b. Further, as described above, the test patterns 31b and 31d are spaced by a predetermined distance from the through-holes 20a and 20b.

For example, in the present embodiment, it is assumed that Da=1.7 [mm] because of the influence of the dimensional tolerance, where Da represents the diameter of the machined through-hole 20a. Here, it is assumed that Db=Dp=1.8 [mm] where Db represents the diameter of the through-hole 20b. Further, it is assumed that the through-hole 20 is offset by 0.1 [mm] toward the fourth edge with respect to the normal position. The position of the through-hole 20a of this case is shown in FIG. 11 by the broken line (P). The position of the through-hole 20b of this case is also shown in FIG. 12 by the chained line (Q).

As shown in FIG. 11, when the diameter Da of the through-hole 20a is smaller than the normal diameter Dp because of the influence of dimensional tolerance, for example, even if the through-hole 20a is machined at the position offset by a predetermined distance (for example, 0.1 [mm]) with respect to the normal position, as described above, the test patterns 31a and 31b are not cut away, thus, the offset of the machining cannot be detected.

However, in the present embodiment, as shown in FIG. 12, the test patterns 31c and 31d are disposed around the other through-hole 20b, as in the through-hole 20a. Further, regardless of the presence or absence of the influence of dimensional tolerance, when the through-hole 20a is offset with respect to the normal position, the through-hole 20b is also offset with respect to the normal position. Therefore, as shown in FIG. 12, the test pattern 31c is cut away in machining the through-hole 20b, thus, the offset of the position at the time of machining can be detected.

As described above, on the semiconductor device 1 according to the present embodiment, the test pattern 31 is formed on the substrate 11 around the position in which each of the through-holes 20a and 20b is formed. For that reason, when the through-hole 20 is machined at a position offset from the normal position, at least a portion of the test pattern 31 is cut away. Accordingly, whether or not the test pattern 31 is cut away can be determined by measuring the impedance between the test terminal 32 and the ground terminal 30a. Based on the result of the determination, whether or not the through-hole 20a is machined at a position offset from the normal position can be determined.

In the present embodiment, the test patterns 31 (31c and 31d) are formed not only on the periphery of the through-hole 20a, but also on the periphery of the through-hole 20b. For that reason, even when the through-hole is machined smaller than the normal size because of the influence of the dimensional tolerance on the through-hole 20, offset of the machining position of the through-hole 20 can be accurately detected. Therefore, the offset of the position of the slit 21b in the connector 21 can be easily and accurately detected, which may contribute to improve reliability of the connection between the semiconductor device 1 and the host 2.

In the above embodiments, the size of the through-hole 20, the width of the test pattern 31, the number of layers of the substrate 11 described are only an example, and not limited to the illustrated values herein. Further, the test pattern 31 described in the first embodiment and the second embodiment is not necessarily provided on the surface layer of the substrate 11 (first surface 11a), and instead may be provided on the inner layer thereof (layer between the first surface 11a and the second surface 11b).

While an embodiment has been described, the embodiment has been presented by way of example only, and is not intended to limit the scope of the inventions. Indeed, the novel embodiment described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:

a substrate;

a nonvolatile semiconductor memory disposed on a surface of the substrate; and a controller disposed on the surface of the substrate, wherein the substrate has a slit on an edge at which interface connection terminals are formed, a ground pattern, first and second wiring patterns that are electrically connected to the ground pattern and extend in a direction in which the slit extends, and a through hole that is formed, in a circular shape having a diameter substantially equal to a distance between the first and second wiring pattern, between the first and second wiring patterns.

2. The semiconductor device according to claim 1, wherein a distance between the first and second wiring patterns is equal to or greater than a size of the through hole in a direction perpendicular to the direction in which the slit extends.

3. The semiconductor device according to claim 1, wherein the through hole is formed at an edge of the substrate opposite to the edge on which the slit is formed.

4. The semiconductor device according to claim 1, wherein lengths of the first and second wiring patterns in the direction are longer than the diameter of the through hole.

5. The semiconductor device according to claim 1, wherein the substrate also has third and fourth wiring patterns that are electrically connected to the ground pattern and extend in the direction, and a second through hole that is formed, in a circular shape having a diameter substantially equal to a distance between the third and fourth wiring pattern, between the third and fourth wiring patterns.

6. The semiconductor device according to claim 5, wherein the through hole and the second through hole are formed at an edge of the substrate opposite to the edge on which the slit is formed.

7. The semiconductor device according to claim 6, wherein the through hole and the second through hole are formed at opposite ends of the edge.

8. The semiconductor device according to claim 6, wherein a distance between the first and second wiring patterns is substantially the same as a distance between the third and fourth wiring patterns.

9. The semiconductor device according to claim 1, wherein the nonvolatile semiconductor memory and the controller are formed on the same surface of the substrate, and the first and second wiring patterns are formed on said same surface.

10. The semiconductor device according to claim 1, wherein the first and second wiring patterns are formed as an inner layer of the substrate.

11. The semiconductor device according to claim 1, further comprising:

a first terminal formed on a surface of the substrate and electrically connected to the first wiring pattern;

a second terminal formed on the surface on which the first terminal is formed and electrically connected to the second wiring pattern; and a third terminal formed on the surface on which the first terminal is formed and electrically connected to the ground pattern.

12. A computing device comprising:

a power source;

a connector; and a semiconductor device that is connected to the connector and operates with power supplied from the power source, the semiconductor device including:

a substrate;

a nonvolatile semiconductor memory disposed on a surface of the substrate; and a controller disposed on the surface of the substrate, wherein the substrate has a slit on an edge at which interface connection terminals connected to the connector are formed, a ground pattern, first and second wiring patterns that are electrically connected to the ground pattern and extend in a direction in which the slit extends, and a through hole that is formed, in a circular shape having a diameter substantially equal to a distance between the first and second wiring pattern, between the first and second wiring patterns.

* * * * *